United States Patent [19]

Chan

[11] Patent Number: 5,243,226
[45] Date of Patent: Sep. 7, 1993

[54] PROGRAMMING OF ANTIFUSES

[75] Inventor: Andrew K. Chan, Palo Alto, Calif.

[73] Assignee: QuickLogic Corporation, Santa Clara, Calif.

[21] Appl. No.: 739,076

[22] Filed: Jul. 31, 1991

[51] Int. Cl.[5] .................. H01L 21/306; G11C 17/00; G06F 7/38
[52] U.S. Cl. ...................... 307/465; 365/96; 437/172
[58] Field of Search ............... 307/465, 465.1; 340/825.22, 825.83, 825.84, 825.91; 365/72, 96, 225.7, 163; 437/172, 170, 922, 193

[56] References Cited

U.S. PATENT DOCUMENTS

| | | | |
|---|---|---|---|
| 4,651,409 | 3/1987 | Ellsworth et al. | 29/576 B |
| 4,730,273 | 3/1988 | Sluss | 365/96 |
| 4,758,745 | 7/1988 | Elgammal et al. | 307/465 |
| 4,783,763 | 11/1988 | Bergman | 365/94 |
| 4,823,181 | 4/1989 | Mohsen et al. | 357/51 |
| 4,857,774 | 8/1989 | El-Ayat et al. | 307/465 |
| 4,873,459 | 10/1989 | El Gammal et al. | 307/465 |
| 4,881,114 | 11/1989 | Mohsen et al. | 357/54 |
| 4,887,241 | 12/1989 | Tran | 365/230.06 |
| 4,910,417 | 3/1990 | El Gammal et al. | 307/465 |
| 4,933,898 | 6/1990 | Gilberg et al. | 365/53 |
| 4,943,538 | 7/1990 | Mohsen et al. | 437/170 |
| 5,008,855 | 4/1991 | Eltoukhy et al. | 365/96 |
| 5,063,537 | 11/1991 | Akrout et al. | 365/96 |
| 5,070,384 | 12/1991 | McCollum et al. | 357/51 |
| 5,110,758 | 5/1992 | Basket | 437/172 |
| 5,126,282 | 6/1992 | Chiang et al. | 437/172 |

OTHER PUBLICATIONS

L. Yau, "Determination of the Fowler-Nordheim Tunneling Barrier from Nitride to Oxide in Oxide:Nitride Dual Dielectric", IEEE Electron Device Letters, vol. EDL-7, No. 6, Jun. 1986, pp. 365-367.

D. Liu, "Scaled Dielectric Antifuse Structure for Field-Programmable Gate Array Applications", IEEE Electron Device Letters, vol. 12, No. 4, Apr. 1991, pp. 151-153.

Brian Cook, Steve Keller, "Amorphous Silicon Antifuse Technology for Bipolar PROMs", 1986 Bipolar Circuits and Technology Meeting, pp. 99-100.

E. Hamdy et al., "Dielectric Based Antifuse for Logic and Memory ICs", IEDM 1988, pp. 786-789.

Primary Examiner—Edward P. Westin
Assistant Examiner—Andrew Sanders
Attorney, Agent, or Firm—Skjerven, Morrill, MacPherson, Franklin & Friel

[57] ABSTRACT

The invention allows programming an antifuse so as to reduce the antifuse resistance and the standard deviation of the resistance without increasing the programming current. This is achieved by passing current pulses of the opposite polarity through the antifuse. In some embodiments, the magnitude of the second pulse is lower than the magnitude of the first pulse. Further, if the antifuse is formed on a semiconductor substrate with one electrode on top of the other electrode and on top of the substrate, the current during the first pulse flows from the top electrode to the bottom electrode and not vice versa. A programming circuitry is provided that allows to program antifuses in a programmable circuit. A driver circuit is connected to each "horizontal" channel and each "vertical" channel. Each driver circuit is controlled by data in the driver circuit. The driver circuits are connected into shift registers so that all the data can be entered from one, two, three or four inputs. No decoding circuitry is necessary. Before programming, the drivers precharge all the channels to an intermediate voltage. During programming, the channels that are not directly connected to the antifuse being programmed are switched to high impedance. As a result, the power consumption is reduced and the programming proceeds faster.

32 Claims, 10 Drawing Sheets

PROGRAMMING OF ANTIFUSES

BACKGROUND OF THE INVENTION

1. Field of the Invention

The present invention relates to electrical devices, and more particularly to methods and circuits for programming of antifuses.

2. Description of Related Art

Programmable semiconductor devices include programmable read only memories ("PROMs"), programmable logic devices ("PLDs"), and programmable gate arrays. Programmable elements suitable for one or more of these device types include fuses and antifuses.

A fuse is a structure which electrically couples its first electrode to its second electrode, but which, when programmed by passage of sufficient current between its electrodes, electrically decouples the first electrode from the second electrode.

An antifuse is a structure which when unprogrammed does not electrically couple its first and second electrodes, but which, when programmed, permanently electrically couples the first and second electrodes. An antifuse is programmed by applying sufficient voltage ("programming voltage") between its first and second electrodes. One type of antifuse comprises a high resistivity material in which a low resistivity filament is formed when the material is heated by electrical current. Amorphous silicon, silicon dioxide and silicon nitride have been used successfully as the high resistivity materials. See, for example, U.S. Pat. No. 4,823,181 issued Apr. 18, 1989 to Mohsen et al.; B. Cook et al., "Amorphous Silicon Antifuse Technology for Bipolar PROMs," 1986 Bipolar Circuits and Technology Meeting, pages 99-100.

An antifuse, when programmed, should have a low resistance. It was generally believed that in order to obtain lower resistance one needs to raise "programming" current (the current passing through the antifuse during programming). Namely, the physics of antifuse programming was believed to be as follows. When the programming voltage is applied between the antifuse terminals, the high resistivity material breaks down at its weakest portion. Current flows through that portion and heats the material. The heat creates a conductive filament through the material. As the filament grows in size, the resistance across the material decreases. Hence the temperature of the material also decreases. Gradually the temperature becomes so low that the conductive filament stops growing. See Hamdy et al., "Dielectric Based Antifuse for Logic and Memory ICs," IEDM 1988, pages 786-789. In order to reduce the resistance further, the current has to be increased so as to generate more heat.

It was confirmed experimentally that a higher programming current does provide a lower resistance. However, the current in a programmable circuit cannot be increased indefinitely because high current can damage circuit devices. Thus, it is desirable to find a programming method that provides a low antifuse resistance while using a low programming current.

Further, the resistance of the programmed antifuse varies from one antifuse to another even among antifuses of the same general construction, and even when the same technique is used to program the antifuses. Since the resistance is variable, designers and users of circuits with antifuses have to accommodate a wide range of antifuse resistances. There is a need for a programming method that would make the resistance less variable.

A typical programmable circuit (for example, a gate array) contains hundreds or thousands of antifuses. The programming circuit must address the antifuses being programmed so as to program only those antifuses. At present, addressing circuits typically require a decoder. The decoder makes the programming circuit more complex. See, for example, U.S. Pat. No. 4,873,459 issued Oct. 10, 1989 to El Gamal et al.

It is desirable to provide a simpler programming circuit suitable for use in programmable circuits with many antifuses. In addition, such a programming circuit should consume little power. Further, the programming circuit should program a large number of antifuses fast.

SUMMARY OF THE INVENTION

This invention allows one to program an antifuse so as to 5 lower the antifuse resistance without increasing the programming current. This capability is achieved, in some embodiments, by using current pulses of the opposite polarity. Namely, the first pulse of the programming current is followed by a second pulse in the opposite direction. The second pulse reduces the resistance even if the first pulse was of such duration that the resistance stopped decreasing during the first pulse. Further, the second pulse reduces the resistance even though the magnitude of the second pulse current is not larger than the magnitude of the first pulse current.

In fact, better results are achieved if the magnitude of the second pulse is lower than the magnitude of the first pulse. For example, the second pulse provides a significant reduction in resistance for a greater number of antifuses if the second pulse is 20-25% lower in magnitude than the first pulse. This discovery runs against the conventional wisdom that a higher programming current always provides a lower resistance.

Further, it has been discovered that the second pulse makes the resistance more predictable. Namely, the second pulse lowers the standard deviation of the resistance.

Further, it has been discovered that the resistance and its standard deviation can be lowered even more by repeating the first and second pulses. Namely, the third pulse in the same direction as the first pulse, and the fourth pulse in the same direction as the second pulse further reduce the resistance and the standard deviation, all without increasing the programming voltage and current. The pair of the first and second pulses can be repeated again a number of times so as to further reduce both the resistance and the standard deviation of the resistance.

It has also been discovered that for some antifuses lower resistance and lower standard deviation is achieved by carefully choosing the polarity of the first pulse. Namely, in some antifuses formed on a semiconductor substrate, one of the electrodes is positioned on top of the other electrode (and on top of the substrate). For such antifuses, lower resistance and standard deviation are achieved if during the first programming pulse the top electrode is at a higher voltage than the bottom electrode.

A programming circuitry is provided that is suitable, in some embodiments, for supplying pulses of the opposite polarity to the antifuse. Some embodiments of the circuitry are suitable for use in a programmable circuit that contains many antifuses. In some embodiments, the circuitry is simple, and it does not include a decoder. The circuitry programs antifuses fast, and it consumes little power.

This summary does not purport to describe all the features of the invention. Other features and aspects of the invention are described below. The invention is defined by the appended claims.

DESCRIPTION OF THE PREFERRED EMBODIMENTS

Figure 1:
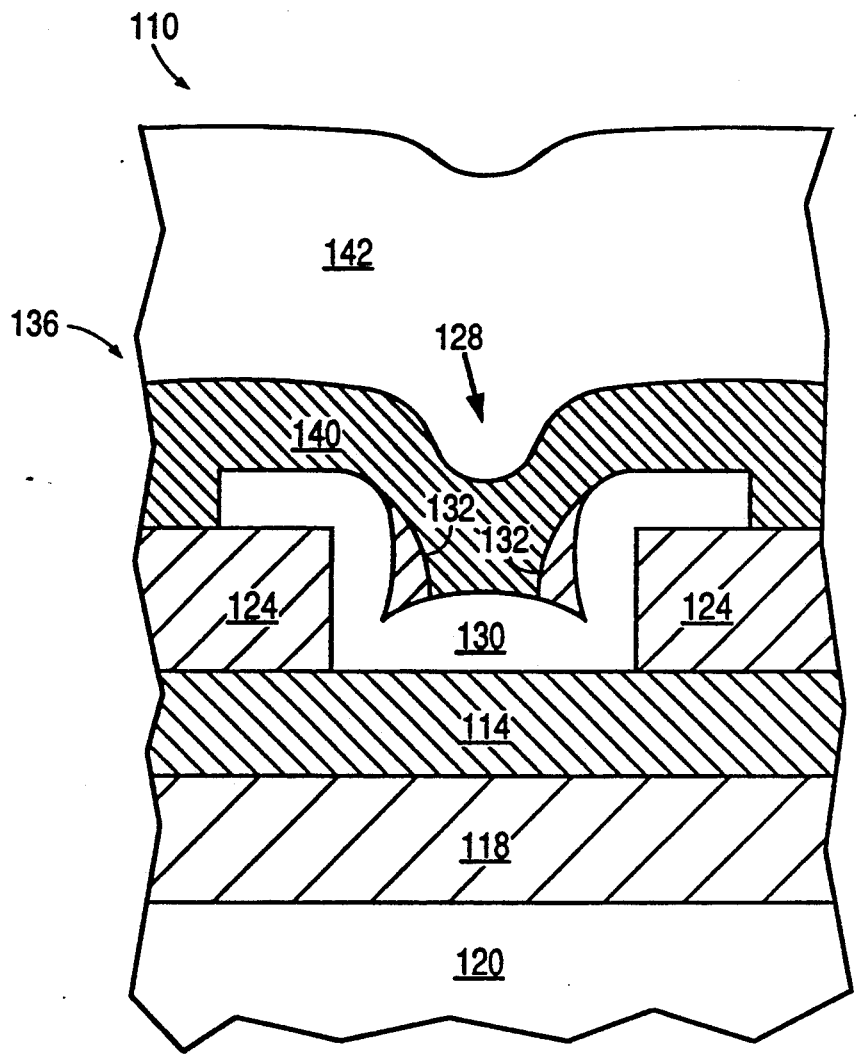
FIG. 1 is a cross-section illustration of one antifuse programmable by the method of this invention.

FIG. 1 shows one of many antifuses programmable by the method of this invention. Antifuse 110 of FIG. 1 is described generally in the U.S. patent application filed Apr. 26, 1991 by Gordon et al. and entitled "Amorphous Silicon Antifuses and Methods for Fabrication Thereof", Ser. No. 07/691,950, incorporated herein by reference.

Briefly, bottom electrode 114 of antifuse 110 is formed above first dielectric layer 118 which in turn is formed on substrate 120. Second dielectric layer 124 is deposited on bottom electrode 114. Via 128 is etched through second dielectric layer 124. Amorphous silicon layer 130 is deposited over via 128. To smooth the step inside via 128, a layer of silicon dioxide is deposited and etched anisotropically to form spacers 132 around the sidewalls of via 128. Then top electrode 136 is formed by depositing barrier metal 140 (such as TiW) and aluminum layer 142. Top electrode 136 and bottom electrode 114 are connected to a programming circuitry (not shown) that programs antifuse 110.

Figure 2:
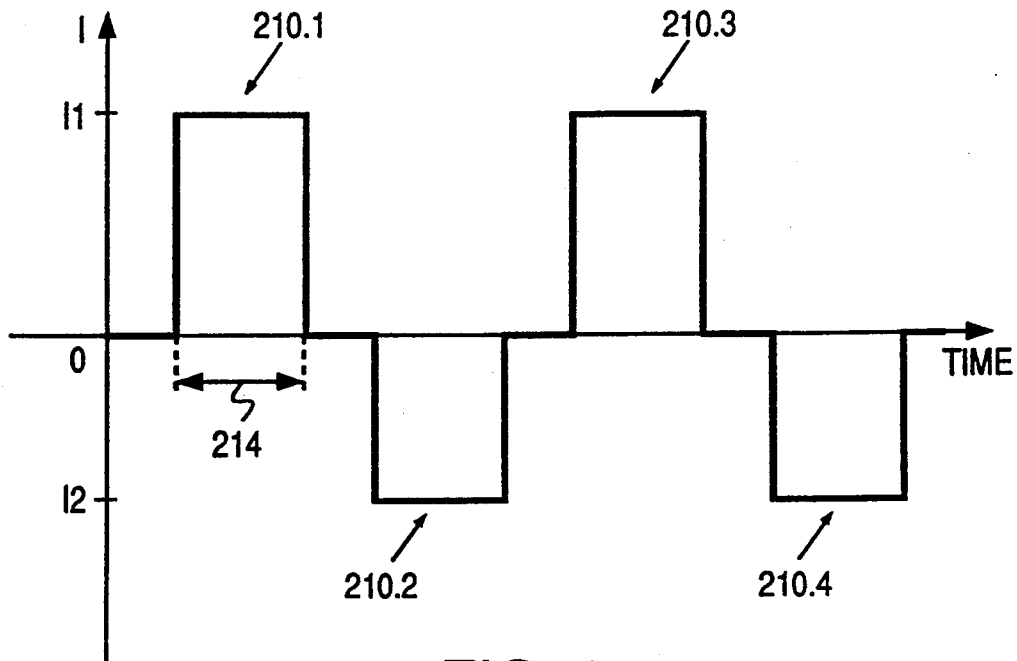
FIG. 2 is a diagram of a current used to program an antifuse in the method of this invention.

Antifuse 110 is programmed by the programming current diagrammed in FIG. 2. The current is created by voltages applied to top electrode 136 and bottom electrode 114.

The first pulse 210.1 is generated by causing top electrode 136 to be at a higher voltage than bottom electrode 114. In one example, top electrode 136 is at 13V and bottom electrode 114 is at ground. Current I1, 11.6 mA in that example, flows from top electrode 136 to bottom electrode 114 creating a conductive filament through amorphous silicon 130. Pulse width 214 is 25 ms in that example. Pulse 210.1 programs antifuse 110.

The resistance of antifuse 110, however, is decreased by the second pulse 210.2 of the opposite polarity. Namely, bottom electrode 114 is caused to be at a higher voltage than top electrode 136. Current I2 flows from the bottom electrode 114 to top electrode 136. Current I2 reduces the antifuse resistance even if $|I2|$ (the magnitude of I2) is not higher than I1.

The antifuse resistance after each pulse varies from one antifuse to another even among antifuses of the same general construction. It is desirable to reduce the standard deviation of the resistance so as to make the resistance more predictable. It has been discovered that the second pulse 210.2 not only reduces the average resistance but also reduces the standard deviation of the resistance. Thus the second pulse 210.2 makes the resistance more predictable.

The second pulse 210.2 reduces the antifuse resistance more consistently if current I2 is lower in magnitude than current I1. Namely, a significant reduction of resistance is achieved in greater number of antifuses if $|I2|$ is below I1 by 20% to 25%. In one example, I1=11.6 mA, and $|I2|$=9 mA. In another example, I1=45 mA, and $|I2|$=35 mA. Reducing $|I2|$ runs against the general rule that a greater current through the antifuse provides lower resistance.

If desired, the resistance is reduced further by repeating the pulses. Namely, a third pulse 210.3 is generated by applying a high voltage to top electrode 136 relative to bottom electrode 114. Current I1 passes through amorphous silicon 130. Current I1 is the same current as during first pulse 210.1. Then a fourth pulse 210.4 of the opposite polarity is generated to pass current I2. Current I2 is the same current as during second pulse 210.2. Pulses 210.3 and 210.4 reduce both the mean and the standard deviation of the antifuse resistance.

If desired, further reduction in the resistance and its standard deviation is achieved under certain circumstances by repeating the pair of pulses a number of times.

Pulse lengths from 1 to 50 ms are believed to be suitable.

Table 1 below summarizes the results achieved in one experiment for antifuses like antifuse 110 of FIG. 1. In that experiment, the thickness of amorphous silicon 130 was approximately 1100Å. The amorphous silicon feature size was 1.2 μm. Each programming pulse 210 was 25 ms long.

TABLE 1

| Pulse No. | Voltage between Electrodes | Current (I1 or I2) | Average Resistance after the Pulse | Standard Deviation of Resistance after the Pulse |
|---|---|---|---|---|
| 1 | 13V | 11.6 mA | 81.2Ω | 15.0Ω |
| 2 | | −9 mA | 60.5Ω | 5.73Ω |
| 3 | | 11.6 mA | | |
| 4 | | −9 mA | 54.7Ω | 4.95Ω |

In another experiment, the following results were achieved.

TABLE 2

| Pulse No. | Voltage between Electrodes | Current (I1 or I2) | Average Resistance after the Pulse | Standard Deviation of Resistance after the Pulse |
|---|---|---|---|---|
| 1 | 13V | 30 mA | 26.4Ω | 26.3Ω |
| 2 | | −24 mA | 17.3Ω | 1.06Ω |
| 3 | | 30 mA | | |
| 4 | | −24 mA | 15.4Ω | 1.28Ω |

The standard deviation after pulse No. 4 in Table 2 appears to be slightly greater then after pulse No. 2. The reason for this probably lies in the measurement errors which were about 1.00Ω to 2.00Ω.

Other experiments have been performed with currents I1 between 11.6 mA and 45 mA and with currents I2 between, respectively, −9 mA and −35 mA. In each experiment, current I2 was 20–25% lower in magnitude than current I1. The average resistance achieved was generally 25–40% lower after pulse No. 4 than after pulse No. 1. The standard deviation was 3 to 20 times lower after pulse No. 4 than after pulse No. 1.

Figure 3:
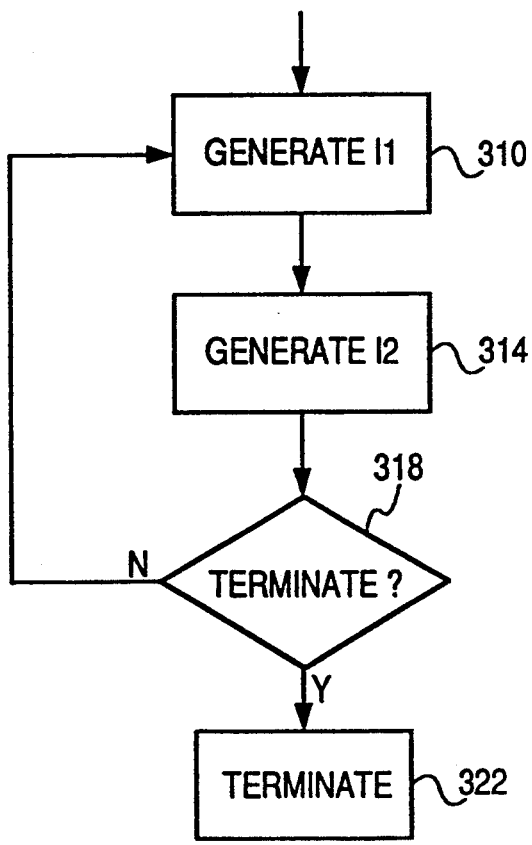
FIG. 3 is a block diagram of a method of this invention.

FIG. 3 is a flowchart of one embodiment of the antifuse programming method described above. At step 310, a high voltage is applied to top electrode 136 relative to bottom electrode 114. Current I1 is generated as a result. At step 314, a high voltage is applied to bottom electrode 114 relative to top electrode 136. Current I2 is generated.

At step 318, a decision is made whether to terminate the programming. Possible decision making methods are described below. If the answer at step 318 is No, control passes back to step 310. The pair of pulses is then repeated at steps 310 and 314. If the answer is Yes, control passes to step 322, and the programming is terminated.

The decision at step 318 is made as follows in one embodiment. The goal of step 318 in that embodiment is to terminate the programming after a predetermined number of pulses, say, number N. Accordingly, a count of the number of pulses is kept during programming. The count is initialized to zero. At step 318, the count is incremented by 2 and then compared to the number N. If the count is greater than or equal to N, step 318 gives the answer Yes. Otherwise, step 318 gives the answer No.

In another embodiment, step 318 measures the resistance of the antifuse being programmed. The programming is terminated when the resistance falls into a predetermined range or below a predetermined value.

In still another embodiment, the two methods above are combined. Namely, programming is terminated when at least one of the following becomes true: (1) the resistance has fallen below a predetermined value; (2) and the count of pulses reaches a predetermined number N.

In some embodiments, different programming methods are used for different antifuses. In some circuits, the resistance of some antifuses is less critical. These antifuses are programmed by fewer programming pulses, for example, only by one pulse. Other antifuses in the same circuits are programmed by a greater number of pulses.

The algorithm of FIG. 3 can be implemented using a general purpose computer as will be obvious to those skilled in the art. Namely, microprocessor controlled field programmable gate array programmers for programming antifuses are known in the art. The microprocessors in the programmers are typically driven by software. One skilled in the art can modify such a programmer to supply current pulses in two directions. Further, one skilled in the art can write a software program to implement the methods of FIG. 3.

The methods of FIGS. 2 and 3 are suitable for programming antifuses of many different constructions. In particular, these methods are suitable for programming the antifuses disclosed in the following U.S. patent applications: application Ser. No. 07/404,996 filed Sep. 7, 1989 by H.T. Chua et al., now abandoned; application Ser. No. 07/447,969 filed Dec. 8, 1989 by H. T. Chua et al.; application Ser. No. 07/691,950 filed Apr. 26, 1991 by K. E. Gordon et al., now abandoned; and application Ser. No. 07/698,648 filed May 10, 1991 by Gordon et al., now abandoned. These applications are incorporated by reference herein.

Figure 4:
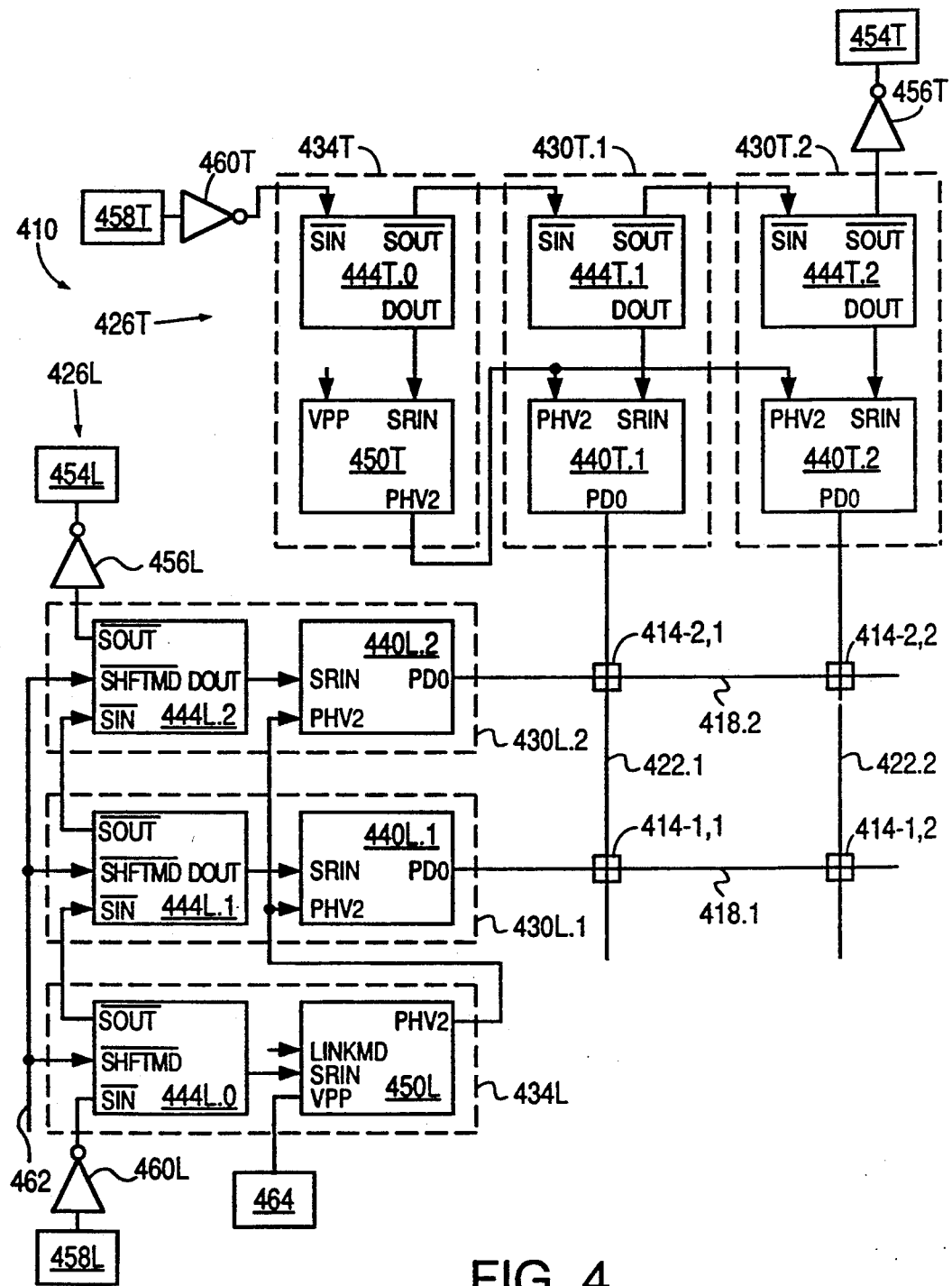
FIG. 4 is a block diagram of a programmable circuit with programming circuitry in accordance with this invention.

FIG. 4 shows a programmable circuit 410 in which antifuses 414-1,1, 414-1,2, 414-2,1, and 414-2,2 can be programmed by the method of FIG. 3. Programmable circuit 410 can be part of a gate array such as described generally in U.S. patent application Ser. No. 07/665,103 by reference, now U.S. Pat. No. 5,122,685 issued Jun. 16, 1992. Circuit 410 can also be part of a programmable array logic or some other programmable device, or it can be a stand alone circuit.

Circuit 410 has "horizontal" channels 418.1, 418.2 and "Vertical" channels 422.1, 422.2. The channels can be routing channels or any other conductive lines. The terms "horizontal" and "vertical" merely refer to how the channels appear in the figure. The channels themselves can run in any direction and be of any shape.

Antifuses ("cross links") 414-1,1, 414-1,2, 414-2,1, and 414-2,2 are provided at intersections of the channels. Each cross link 414-i,j has one electrode connected to horizontal channel 418.i and the other electrode connected to vertical channel 422.j.

Programmable circuit 410 includes programming circuits 426L and 426T for programming the cross links 414. Reference numbers with suffix "L", such as "426L", designate circuits shown on the left side of the figures. Reference numbers with suffix "T", such as "426T", designate circuits shown on the top of the figures. Programming circuit 426L includes driver circuits 430L.1 and 430L.2 and control circuit 434L. Programming circuit 426T includes driver circuits 430T.1 and 430T.2 and control circuit 434T. Programming circuits 426L and 426T have the same construction.

Channel 418.1 is connected to output PDO of driver circuit 430L.1. Channel 418.2 is connected to output PDO of driver circuit 430L.2. Vertical channels 422.1 and 422.2 are connected to outputs PDO of respective driver circuits 430T.1 and 430T.2. All driver circuits 430 have the same construction.

Each driver circuit 430 can provide on its output PDO any one of the following: (a) programming voltage VPP which is equal to 13 V during pulse 210.1 (FIG. 2), or 9 V during pulse 210.2; (b) ground (0 V); (c) an intermediate voltage VI=6.25 V; and (d) high impedance ("HI"). For example, when antifuse 414-1,1 is being programmed by passing a current from vertical channel 422.1 to horizontal channel 418.1, driver circuit 430T.1 supplies voltage VPP and driver circuit 430L.1 supplies ground. During the programming pulse in the opposite direction, driver circuit 430L.1 supplies voltage VPP, and driver circuit 430T.1 supplies ground.

Before each pulse, all the driver circuits 430 provide voltage VI (6.25 V) so as to precharge all the channels 422 and 418 to VI. During the programming pulses through antifuse 414-1,1, driver circuits 430T.2 and 430L.2 provide high impedance. If antifuses 414-1,2, 414-2,1 and 414-2,2 have not been programmed, then channels 418.2 and 422.2 float at VI during the pulses. Voltage VI is chosen so that antifuses 414-1,2, 414-2,1 and 414-2,2 do not get misprogrammed. Namely, neither voltage VPP - VI nor voltage (VI - ground) across an antifuse 414 are sufficient to program the antifuse.

Because during pulses 210, driver circuits 430T.2 and 430L.2 provide high impedance rather than voltage VI, power consumption is reduced and under-programming is less likely. Indeed, suppose that cross link 414-1,2 was programmed before cross link 414-1,1. When cross link 414-1,1 is being programmed, channel 418.1 and channel 422.2 are connected through cross link 414-1,2. Consider, for example, the programming pulse in which circuit 430L.1 provides VPP and circuit 430T.1 provides ground. If circuit 430T.2 provided VI during the pulse, circuit 430T.2 would pull down the voltage on channel 418.1. Charging channel 418.1 to VPP would require more power. Further, it is likely that channel 418.1 would not charge to VPP, and cross link 414-1,1 would not get programmed. Since circuit 430T.2 actually provides high impedance, channel 418.1 is charged to VPP fast, and further cross link 414-1,1 is unlikely to remain unprogrammed.

In normal operation, when programmable circuit 410 has been programmed, the outputs PDO of all driver circuits 430 are at high impedance so as not to interfere with the normal operation.

All the driver circuits 430 have the same construction. Driver circuit 430L.1 includes a programming driver 440L.1 and a cell 44L.1 includes a programming driver 440L.1 and a cell 444L.1. Cell 444L.1 provides on its output DOUT a logical 1 or a logical 0. Logical 1 is indicated by voltage VCC. VCC=6.25 V during programming. Logical 0 is indicated by ground voltage. Output DOUT is connected to input SRIN of driver 440L.1. When DOUT is logical 1, driver 440L.1 connects its output PDO to its input PHV2. When output DOUT is 0, output PDO is at high impedance. See the following Table 3, second and third columns. In Table 3, "HI" stands for high impedance. Signal $\overline{\text{SHFTMD}}$ will be described below.

TABLE 3

(programming operation; $\overline{\text{PROGMD}}$ = low)

| $\overline{\text{SHFTMD}} =$ LINKMD | Cell 444 or 628 DOUT | Driver 440 PDO | Control Driver 450 PHV2 | Driver 624 PDO |
|---|---|---|---|---|
| high (program an antifuse) | 1/0 | PHV2/HI | VPP/GND | VH/GND |
| low (shift in) | 1 | PHV2 = VI | VI | VH |

TABLE 4

(normal operation; $\overline{\text{PROGMD}}$ = high)

| Cell 444 or 628 DOUT | Driver 440 PDO | Driver 624 PDO |
|---|---|---|
| 0 | HI | GND |

Inputs PHV2 of drivers 440L.1 and 440L.2 are connected to output PHV2 of control circuit 434L. Control circuit 434L includes control driver 450L and cell 444L.0. Cell 444L.0 has the same construction as the cells 444L.i, i=1,2. Output DOUT of cell 444L.0 is connected to input SRIN of driver 450L. When output DOUT is 0, output PHV2 of driver 450L is at ground. See Table 3 above, second and fourth columns. When output DOUT is 1, output PHV2 is at either VPP or VI, depending on signal $\overline{\text{SHFTMD}}$ as described below.

All cells 444L are connected into a shift register. The bit to be provided on output DOUT is shifted into the cell 444L.i through cell input $\overline{\text{SIN}}$ and shifted out to the next cell 444L.i+1 through output $\overline{\text{SOUT}}$. The bits are shifted in and out in an inverse form. In particular, output DOUT is the inverse of the bit on output $\overline{\text{SOUT}}$, and the bit on DOUT is the inverse of the bit shifted in through $\overline{\text{SIN}}$. Output $\overline{\text{SOUT}}$ of each cell 444L.i is connected to input $\overline{\text{SIN}}$ of the next cell 444L.i+1, except that output $\overline{\text{SOUT}}$ of the last cell 444L.2 is connected to output pad 454L through inverter 456L. The bits are shifted into cells 444L from input pad 458L which is connected through inverter 460L to input $\overline{\text{SIN}}$ of cell 444L.0. The shifting operation is clocked by a clock signal (not shown) in a manner well known in the art.

Each cell 444 has an input $\overline{\text{SHFTMD}}$. The inputs $\overline{\text{SHFTMD}}$ of all cells 444 are connected to line 462 providing signal $\overline{\text{SHFTMD}}$. Control driver 450L has an input LINKMD which during the entire programming operation is equal to $\overline{\text{SHFTMD}}$. When bits are being shifted into the cells 444, $\overline{\text{SHFTMD}}$ and LINKMD are low. When the programming voltages and currents are supplied to the antifuses, $\overline{\text{SHFTMD}}$ and LINKMD are high.

When bits are being shifted in, low $\overline{\text{SHFTMD}}$ causes outputs DOUT of all cells 444 to be at 1 no matter what bits are being shifted in and out. See Table 3 above. Consequently, outputs PDO of drivers 440 provide the signal from outputs PHV2 of respective control drivers 450. Low LINKMD causes outputs PHV2 of control drivers 450 to be at VI. See Table 3. As a result, channels 418 and 422 get precharged to VI.

When the bits have been shifted in, $\overline{\text{SHFTMD}}$ and LINKMD become high. Outputs PDO of drivers 440 are then driven to PHV2 or high impedance as shown in Table 3. PHV2 is either VPP or ground. Voltage VPP is provided by an external circuit 464 to inputs VPP of both control drivers 450. Circuit 464 also provides on inputs VPP a suitable programming current as shown in FIG. 2.

Figure 5:
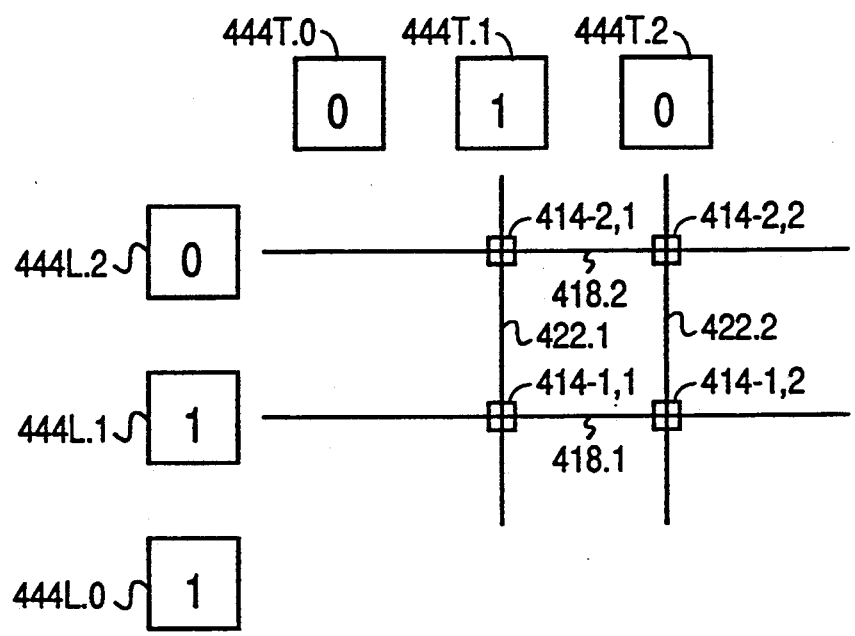
FIG. 5 is a block diagram of the programmable circuit of FIG. 4 with data values during programming.

FIG. 5 illustrates the bits in cells 444 when antifuse 414-1,1 is being programmed by a pulse in which horizontal channel 418.1 is high and vertical channel 422.1 is low. Namely, cell 444L.0 contains one, cell 444L.1 contains one, and cell 444L.2 contains zero. Cell 444T.0 contains zero, cell 444T.1 contains one, and cell 444T.2 contains zero.

Each cell 444 has an input $\overline{\text{PROGMD}}$ (not shown). All the inputs $\overline{\text{PROGMD}}$ receive the same signal $\overline{\text{PROGMD}}$ (not shown) In programming operation, signal $\overline{\text{PROGMD}}$ is low, and the signals are as shown in Table 3. In normal operation, signal $\overline{\text{PROGMD}}$ is high, causing outputs DOUT of all cells 444 to be at 0 no matter what bits have been shifted in. See Table 4 above. Consequently, outputs PDO of all drivers 440 are at high impedance. Thus programming circuits 426L and 426T do not interfere with the normal operation of programmable circuit 410.

Since the cells 444L are connected into a shift register, only one input, namely input pad 458L, is needed to shift the bits into cells 444L. Likewise, only one input, namely input pad 458T, is needed to shift the bits into cells 444T. In one embodiment, output $\overline{\text{SOUT}}$ of cell 444L.2 is connected directly to input $\overline{\text{SIN}}$ of cell 444T.0. Inverters 456L and 460T and pads 454L and 458T are absent. In this embodiment, only one input pad 458L is needed to shift the bits into all cells 444. If programmable circuit 410 is built in an integrated circuit, only one pin is needed to shift in all the bits identifying the antifuses being programmed. The number of pins used for programming is kept to a minimum as a result.

In the embodiment shown on FIG. 4, the bits can be shifted in from both pads 458L and 458T simultaneously. In another variation, output pad 454L is connected to input pad 458T, and the bits are shifted into all cells 444 from pad 458L. If both input pads 458L and 458T are used, the bits are shifted in faster. Alternatively, if only pad 458L is used, the interface to programmable circuit 410 during programming is simpler. A flexible structure is thus provided which allows both a fast data entry and a simple interface.

The programming scheme of FIG. 4 is used in programmable circuits containing hundreds and thousands of antifuses. The antifuses being programmed are identified uniquely by the bits in cells 444. Hence no decoding circuitry is needed to identify the antifuses. Moreover, several antifuses can be programmed simultaneously. Even antifuses connected to different pairs of channels can be programmed simultaneously. For example, cross links 414-1,1 and 414-2,2 are programmed at the same time if cell 444L.1, 444L.2, 444T.1 and 444T.2 all contain 1's. Care should be taken that cross links 414-1,2 and 414-2,1 do not get misprogrammed. Misprogramming of cross links is prevented by isolating the cross links by pass links and pass transistors as described below.

Figure 6:
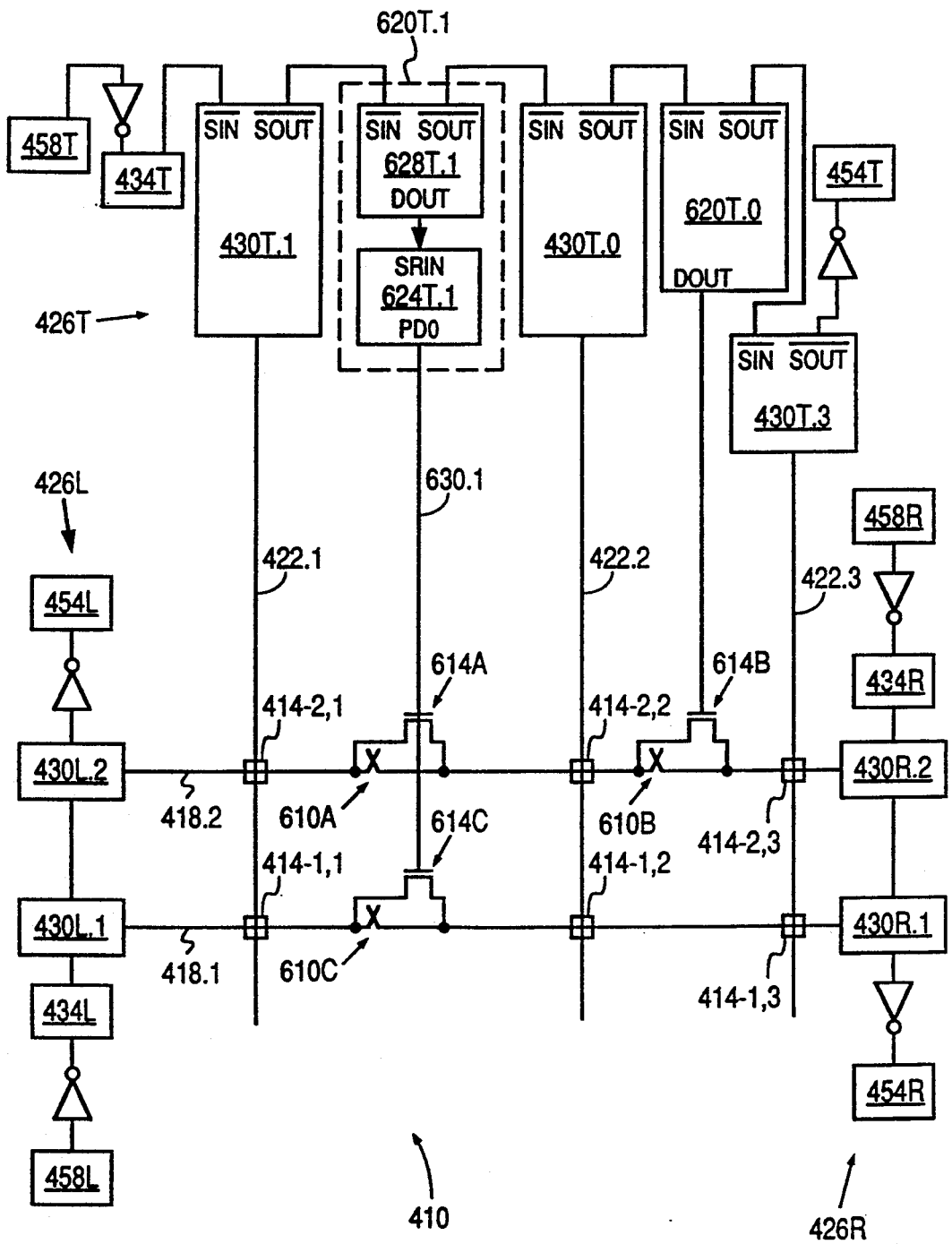
FIGS. 6 and 7 are block diagrams of programmable circuits of this invention.

FIG. 6 shows programmable circuit 410 with three vertical channels 422.1, 422.2, 422.3 and with six cross links 414-i,j, i=1,2; j=1,2,3. Horizontal channels 418 are connected to programming circuit 426L comprising control circuit 434L and driver circuits 430L.1, 430L.2 as described above in connection with FIG. 4. Circuits 430L and 434L are connected into a shift register which is shown schematically by lines interconnecting these circuits. Vertical channels 422 are connected to programming circuit 426T comprising control circuit 434T and driver circuits 430T.1, 430T.2, 430T.3 that are similar to driver circuits 430T of FIG. 4.

Horizontal channel 418.2 is divided into three segments by pass links 610A and 610B. Each pass link 610 is an antifuse which may or may not have the same construction as cross links 414. Pass links 610A and 610B programmably connect the segments of horizontal channel 418.2 to each other. Pass links are described generally in the above-mentioned application Ser. No. 07/665,103.

Similarly, horizontal channel 418.1 is divided into two segments by pass link 610C.

NMOS pass transistor 614A provides a shunt path for pass link 610A. Similarly, NMOS pass transistors 614B and 614C provide shunt paths for respective pass links 610B and 610C. Transistors 614 are off during normal operation. Transistors 614 are sometimes turned on during programming as described below.

Horizontal channels 418.1, 418.2 are connected to programming circuit 426R which includes control Circuit 434R and driver circuits 430R.1 and 430R.2. Reference numbers with suffix "R", such as "426R", designate circuits shown on the right side of the figures. Programming circuit 426R has the same construction as programming circuit 426L.

Programming circuit 426R is used to program pass links 610. For example, pass link 610A is programmed as follows. Driver circuit 430L.2 is caused to supply a programming voltage VPP. Driver circuit 430R.2 is caused to supply ground. Transistor 614B is turned on, and transistor 614A is turned off. As a result, a programming current flows through pass link 610A.

A current in the opposite direction is passed in a similar manner.

The gate of transistor 614A is controlled by driver circuit 620T.1. Driver circuit 620T.1 includes driver 624T.1 and cell 628T.1. Cell 628T.1 has the same construction as cells 444 described above in connection with FIG. 4. Cell 628T.1 is connected into the same shift register as cells 444T. Cell 628T.1 is connected into the shift register between the cells of driver circuits 430T.1 and 430T.2.

Output DOUT of cell 628T.1 is connected to input SRIN of driver 624T.1. Output PDO of driver 624T.1 is connected to the gates of transistors 614A and 614C by conductive line 630.1. The voltage on output PDO is determined by output DOUT of cell 628T.1 as is indicated above in Tables 3 and 4. Namely, when output DOUT is 1, output PDO of driver 624T.1 is at a high voltage VH sufficient to turn on transistors 610A and 610C even when the sources and drains of the transistors are at VPP. In one embodiment, VPP is 9 V or 13 V, and VH=14.5 V.

When output of DOUT of cell 628T.1 is 0, output PDO of driver 624T.1 is at ground. Transistors 610A and 610C are off.

The gate of transistor 614B is controlled by driver circuit 620T.2 which is similar to driver circuit 620T.1. The cell (not shown) of driver circuit 620T.2 is connected into the shift register with cells 444T and 620T.1.

In normal operation, all the outputs DOUT of all cells 624 are 0. See Table 4 above. Thus, all transistors 614 are off.

In some variations, programming circuit 426R is used to program cross links 414. For example, in one variation, cross link 414-1,2 is programmed by causing driver circuit 430T.2 to provide voltage VPP and driver circuit 430R.1 to provide ground voltage, and then by causing driver circuit 430R.1 to provide VPP and driver circuit 430T.2 to provide ground voltage. Transistor 614C is off during programming.

In another variation, driver circuits 430L.1 and 430R.1 provide the same voltage to channel 418.1, and transistor 614C is on.

Pass links 610 are used to isolate cross links 414-i,j from each other and to programmably connect different segments of the respective channels. In some embodiments, pass links are also provided in vertical channels 422. Pass transistors of pass links in vertical channels 422 are driven by driver circuits like circuit 620T.1 that are connected into the shift registers of circuits 426L or 426R or both.

The bits that control transistors 614 are shifted into cells 628 together with the bits that control driver circuits 430T. Thus no separate input pad is needed to control transistors 614. In one variation, all the bits are shifted into cells 444 and 628 simultaneously using three input pads: 458L, 458T and 458R. In another variation, all the bits are shifted in from input pad 458L; output pad 454L is connected to input pad 458T, and output pad 454T is connected to input pad 458R. In still another variation, the bits are shifted in from two pads only. For example, pad 454T is connected to pad 458R, and the bits are shifted in from pads 458L and 458T. In another example, pad 454L is connected to pad 458T, and the bits are shifted in from pads 458L and 458R.

Figure 7:
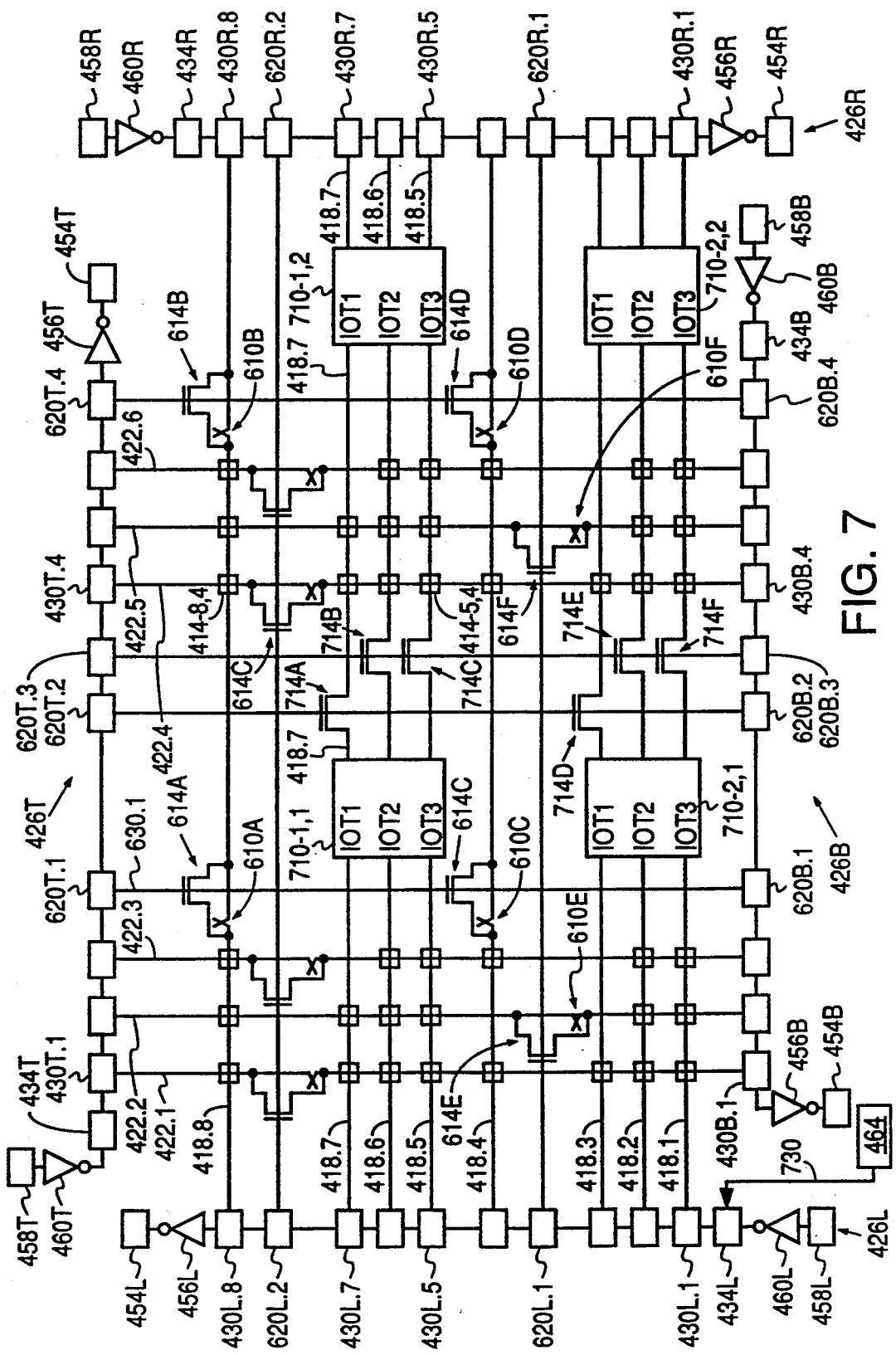

FIG. 7 shows a programmable gate array such as described generally in the above mentioned patent application Serial No. 07/665,103, now U.S. Patent No. 5,122,685. The gate array has an array of logic cells 710-i,j, i=1,2; j=1,2. The gate array has horizontal channels 418.1 through 418.8 and vertical channels 422.1 through 422.6. Programming circuits 426L and 426R are connected to the opposite ends of horizontal channels 418. Programming circuits 426T and 426B are connected to the opposite ends of vertical channels 422. Reference numbers with suffix "B", such as "426B", designate circuits shown at the bottom of the figures. The programming circuits 426 are similar to circuits 426 of FIG. 6.

Vertical channels 422.1 through 422.6 are routing channels that pass between the columns of logic cells 710. Vertical channel 422.1 is connected at its ends to respective driver circuits 430T.1 and 430B.1. Each vertical channel 422.i is connected to two such circuits 430.

Horizontal channel 418.1 is connected at its ends to driver circuits 430L.1 and 430R.1. Each horizontal channel 418.i is connected to two such circuits 430.

Horizontal channels 418.4 and 418.8 are routing channels that pass between rows of logic cells 710. Horizontal channel 418.7 is an input/output line that is connected to terminals IOT1 of logic cells 710-1,1 and 710-1,2. Terminals IOT1 can be input terminals, output terminals, or input/output terminals. While horizontal channel 418.7 is shown in FIG. 7 as interrupted by logic cells 710-1,1 and 710-1,2, horizontal channel 418.7 is not actually interrupted. Horizontal channel 418.7 connects terminals IOT1 of logic cells 710-1,1 and 710-1,2 to each other through NMOS pass transistor 714A. When transistor 714A is on, terminals IOT1 are electrically connected to each other by channel 418.7. When transistor 714A is off, terminals IOT1 are disconnected from each other. In one embodiment, transistor 714A is off during normal operation, and is turned on as needed during programming.

Similarly, horizontal channel 418.6 is a conductive line that connects terminals IOT2 of logic cells 710-1,1 and 710-1,2 to each other through NMOS pass transistor 714B. Horizontal channel 418.5 connects terminals IOT3 of logic cells 710-1,1 and 710-1,2 to each other through NMOS pass transistor 714C. Likewise, horizontal lines 418.3, 418.2, 418.1 connect respective terminals IOT1, IOT2, IOT3 of logic cells LC-2,1 and LC-2,2 to each other through respective NMOS pass transistors 714D, 714E, 714F.

Cross links 414 are provided at selected intersections of vertical channels 422.1 through 422.6 with horizontal channels 418.1 through 418.8.

Horizontal channel 418.8 is segmented by pass links 610A and 610B. Horizontal channel 418.4 is segmented by pass links 610C and 610D. Each pass link 610 is connected in parallel with a pass transistor 614 as described above in connection with FIG. 6. The gates of transistors 614A and 614C are connected by vertical conductive line 630.1 to outputs PDO of driver circuits 620T.1 and 620B.1. Driver circuits 620T.1 and 620B.1 have the same construction as driver circuit 620T.1 of FIG. 6. Driver circuits 620T.1 and 620B.1 provide the same voltage on their outputs PDO if their respective cells (not shown) contain the same bit values. Some embodiments include only one of driver circuits 620T.1, 620B.1. The use of two driver circuits, however, allows to switch the signal on line 630.1 faster. Further, the use of two driver circuits helps ensure that line 630.1 is charged to the appropriate voltage even in the presence of a charge leakage.

Pass transistors 614B and 614D are controlled by driver circuits 620T.4 and 620B.4 in a similar manner.

Vertical channel 422.2 is segmented by pass link 610E which is connected in parallel with NMOS pass transistor 614E. Vertical channel 422.5 is segmented by pass link 610F which is connected in parallel with NMOS pass transistor 614F. The gates of transistors 614E and 614F are controlled by driver circuits 620L.1 and 620R.1 which are similar to driver circuits 620T.1 and 620B.1.

Channels 422.1, 422.3, 422.4 and 422.6 are also segmented by pass links. The respective pass transistors are controlled by circuits 620L.2 and 620R.2.

Cross links 414 and pass links 610 are programmed by methods like the methods described above in connection with FIGS. 4-6.

The gates of transistors 714A and 714D are connected to each other and to the outputs of driver circuits 620T.2 and 620B.2. Driver circuits 620T.2 and 620B.2 have the same construction as driver circuit 620T.1. The gates of transistors 714B, 714C, 714E and 714F are controlled by similar driver circuits 620T.3 and 620B.3. In some embodiments, one of driver circuits 620T.2 and 620B.2 is omitted. In some embodiments, one of driver circuits 620T.3 and 620B.3 is omitted. The use of both driver circuits 620T.2 and 620B.2, as well as both driver circuits 620T.3 and 620B.3 allows to switch the gates of transistors 714 faster. Further, the use of all the four driver circuits helps insure that the gates of transistors 714 are charged to the appropriate voltage even in the presence of charge leakage.

Bits are shifted into circuit 426L through input pad 458L and inverter 460L. Bits can be shifted out of circuit 426L through inverter 456L and output pad 454L. See the discussion above in connection with FIG. 4. Likewise, bits are shifted into circuit 426T through input pad 458T and inverter 460T. Bits can be shifted out of circuit 426T through inverter 456T and output pad 454T. Bits are shifted into circuit 426R through input pad 458R and inverter 460R. Bits can be shifted out of circuit 426R through inverter 456R and output pad 454R. Bits are shifted into circuit 426B through input pad 458B and inverter 460B. Bits can be shifted out of circuit 426B through inverter 456B and output pad 454B.

In one variation, the bits are shifted in simultaneously from input pads 458L, 458T, 458R and 458B. The shifting operation is then fast. In another variation, all the bits are shifted in from only one, two or three of input pads 458. For example, in one variation, all the bits are shifted in from pad 458R. In this variation, output pad 454R is connected to input pad 458B, output pad 454B is connected to input pad 458L, and output pad 454L is connected to input pad 458T. In another variation, all the bits are shifted in from input pads 458T and 458B. In this variation, output pad 454B is connected to input pad 458L, and output pad 454T is connected to input pad 458R. In still another variation, all the bits are shifted in from pads 458R, 458B, and 458L. In this variation, output pad 454L is connected to input pad 458T. In general, all the bits can be shifted in from any given combination or subcombination of input pads 458 as will be obvious to those skilled in the art.

In one embodiment, every cross link 414 and every pass link 610 has a construction as in FIG. 1. The top electrode of each cross link 414-i,j is connected to vertical channel 422.j, and the bottom electrode is connected to horizontal channel 418.i. When cross link 414-i,j is programmed by programming pulse 210.1 (FIG. 2), driver circuits 430T.j and 430B.j provide programming voltage VPP and driver circuits 430L.i and 430R.i provide ground. All the pass transistors, if any, in horizontal channel 418.i and 422.j are on. Pulse 210.2 is generated similarly.

Voltage VPP is provided by an external circuit 464. Output 730 of circuit 464 is connected to inputs VPP of all control circuits 434. Only the connection to control circuit 434L is shown. In one embodiment, VPP is 13 V during pulse 210.1 and 9 V during pulse 210.2. During pulse 210.1, circuit 464 limits the current on its output 730 to an appropriate value. In one embodiment that value is 30 mA. The current through cross link 414-i,j depends on the series impedance of the electrical paths used to program the cross link. The series impedance depends, in turn, on the position of the cross link in the gate array. In particular, the series impedance depends on the number of pass transistors in the electrical paths. Thus, in some embodiments the current through some cross links 414 during pulse 210.1 approaches its maximum value of 30 mA, while the current through others is around 12 mA.

During pulse 210.2, voltage VPP is lowered from 13 V to 9 V. As a result, the programming current decreases by an appropriate value in some embodiments. In other embodiments, the programming current does not decrease or decreases insignificantly for some antifuses. This is because the programming current is limited by the pass transistors and by transistors in programming circuits 426. During pulse 210.1, some of these transistors may be in saturation. Consequently, the current may decrease insignificantly or not at all. To decrease the current to an appropriate value, some embodiments of circuit 464 lower the current limit during pulse 210.2. In one embodiment, the current limit is 30 mA during pulse 210.1 and 25 mA during pulse 210.2.

Circuit 464 also limits the current during pulses 210.3, 210.4, and other pulses 210, if any.

Circuit 464 limits the current similarly when pass links 610 are being programmed.

In some embodiments, circuit 464 sets different current limits for different antifuses.

Figure 8:
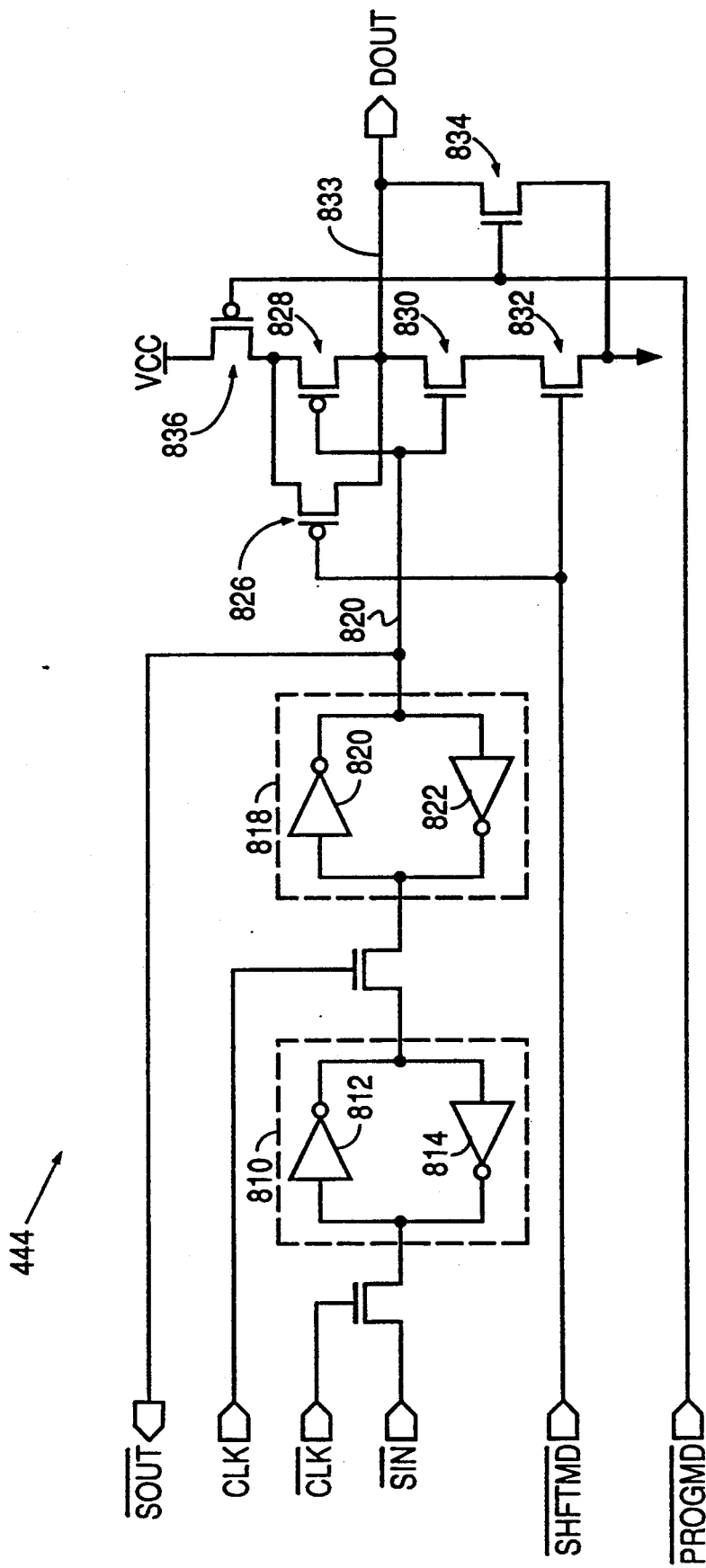
FIGS. 8 through 11 are circuit diagrams of portions of the programmable circuits of FIGS. 4, 6 and 7.

FIG. 8 is a circuit diagram of one embodiment of a cell 444. When data are shifted in and out of the cell, the cell is clocked by clock signal CLK and by complementary clock signal $\overline{CLK}$. Signals CLK and $\overline{CLK}$ are non-overlapping, that is, they are not high at the same time. In one embodiment, CLK and $\overline{CLK}$ are 1 MHz signals. In other embodiments, the frequency of the signals is up to 3 MHz. Such signals, and methods of generating them, are well-known in the art.

Cell 444 has two flip-flops connected in series: flip-flop 810 formed by cross-coupled CMOS inverters 812, 814, and flip-flop 818 formed by cross-coupled CMOS inverters 820 and 822. Output 820 of flip-flop 818 is connected to output $\overline{SOUT}$.

In programming operation, signal $\overline{PROGMD}$ is low; NMOS transistor 834 is off and PMOS transistor 836 is on. PMOS transistors 826 and 828 and NMOS transistors 830 and 832 then form a NAND gate whose inputs are output 820 and $\overline{SHFTMD}$, and whose output is DOUT. In normal operation, $\overline{PROGMD}$ is high; transistor 834 is on and transistor 836 is off. DOUT is then pulled to ground.

Figure 9:
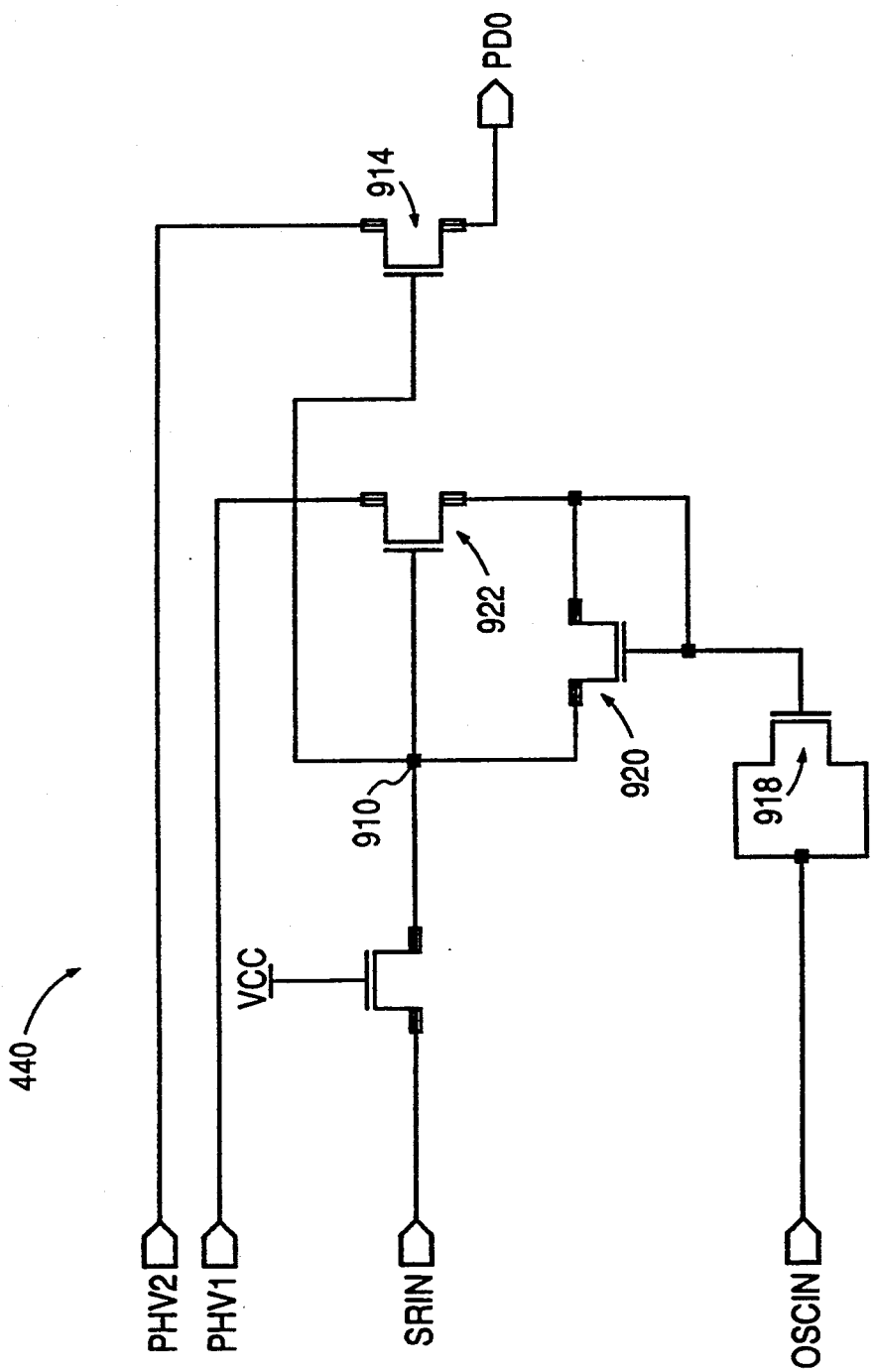

FIG. 9 is a circuit diagram of one embodiment of a driver 440. Externally supplied signal PHV1 is about 13 V in programming operation. When input SRIN is logical 0 (ground), node 910 is low, and NMOS transistor 914 is off. Output PDO is at high impedance.

When input SRIN is 1 (VCC), node 910 charges up. Externally supplied oscillator signal OSCIN oscillates between ground and VCC (6.25 V) at a frequency between 1 MHz and 50 MHz (39 MHz in one embodiment). Such oscillator signals, and methods of generating them, are well known in the art. NMOS transistor 918 is connected as a capacitor, with its source and drain connected to OSCIN. Transistor-capacitor 918 and NMOS transistors 920 and 922 form a charge pump pumping node 910 to about 14.5 V. Transistor 914 turns on connecting output PDO to input PHV2.

Transistor 914 is chosen so as to limit the current at output PDO to a safe value. In one embodiment, the width/length dimension of transistor 914 is $111\lambda/2.5\lambda$, where $\lambda = 0.6 \mu m$.

Figure 10:
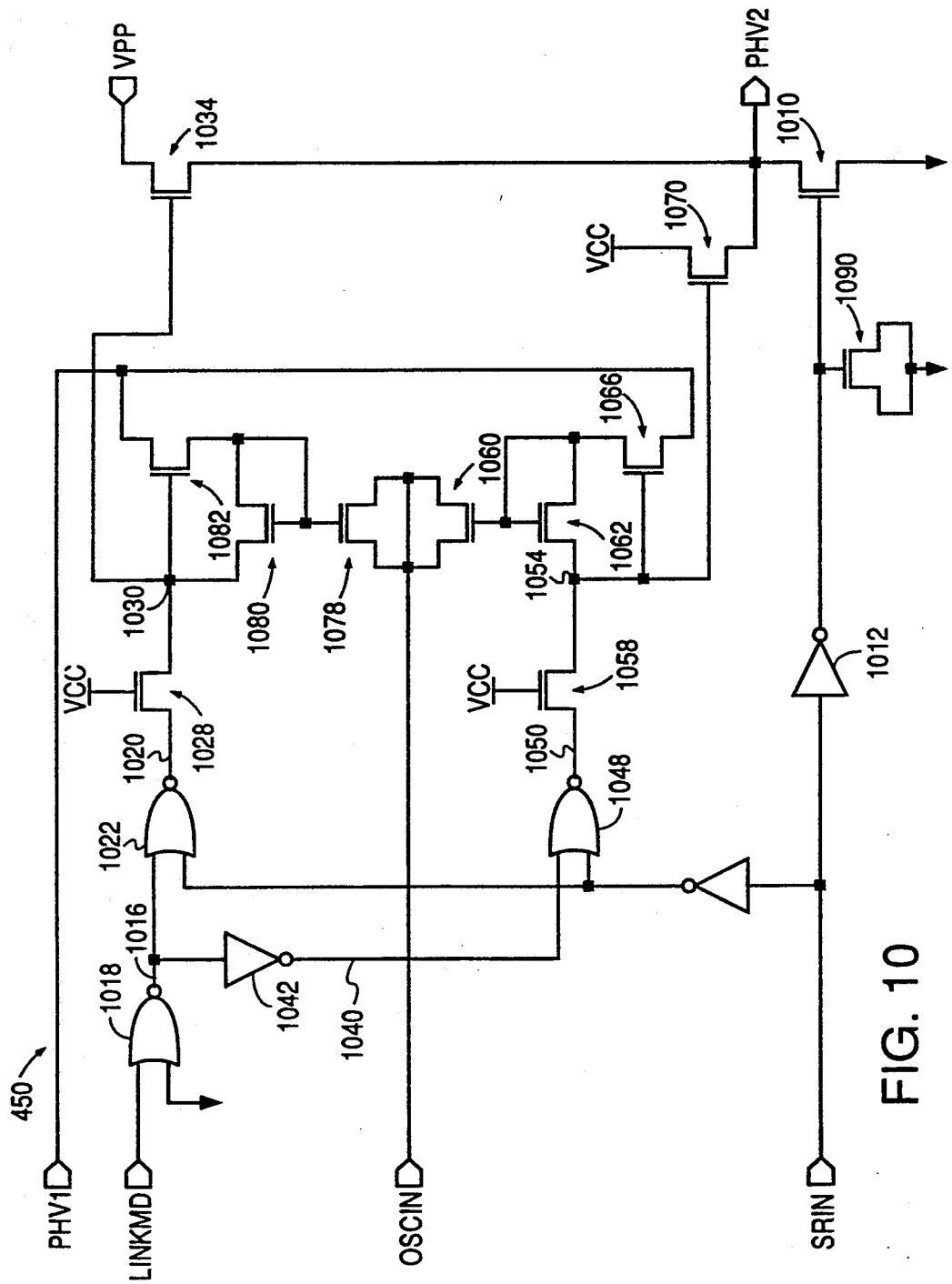

FIG. 10 is a circuit diagram of one embodiment of a control driver 450. Input SRIN is connected to the gate of NMOS transistor 1010 through inverter 1012. When input SRIN is 0, transistor 1010 is on, pulling output PHV2 to ground.

When input SRIN is 1 (VCC), transistor 1010 is off. The signal on output PHV2 is determined by input LINKMD. When LINKMD is low, output 1016 of NOR gate 1018 is high. Output 1020 of NOR gate 1022 is low. NMOS transistor 1028 is on, so node 1030 is low. Transistor 1034 is therefore off. Hence input VPP is cut off from output PHV2.

Output 1040 of inverter 1042 is low. Both inputs of NOR gate 1048 are low, therefore its output 1050 is high. Node 1054 initially charges through NMOS transistor 1058 to VCC minus the threshold voltage of transistor 1058. VCC is 6.25 V, and the threshold voltage is 0.75 V. Inputs OSCIN and PHV1 are the same as in driver 440 of FIG. 9. MOSFETs 1060, 1062 and 1066 form a charge pump that pumps the voltage at node 1054 up to about 14.5 volts. Transistor 1070 turns on providing voltage VCC=6.25 V on output PHV2. This voltage is shown as VI in Table 3 above.

When input SRIN is 1 and LINKMD is high, node 1016 is low, and so is the other input of NOR gate 1022. Hence output 1020 of NOR gate 1022 is high. Node 1030 charges up. NMOS transistors 1078, 1080 and 1082 form a charge pump that pumps the voltage at node 1030 to about 14.5 V. Transistor 1034 turns on and connects input VPP to output PHV2. Output 1050 of NOR gate 1048 is low. Hence transistor 1070 is off cutting off voltage VCC from output PHV2.

Transistor 1090 is connected as a capacitor between the gate of transistor 1010 and ground. Transistor 1090 slows down the transitions of the signal on the gate of transistor 1010. As a result, the transitions of output PHV2 in response to the transitions of input SRIN are slowed down. This diminishes the effect of transitions of output PHV2 on signals capacitively coupled to PHV2.

Figure 11:
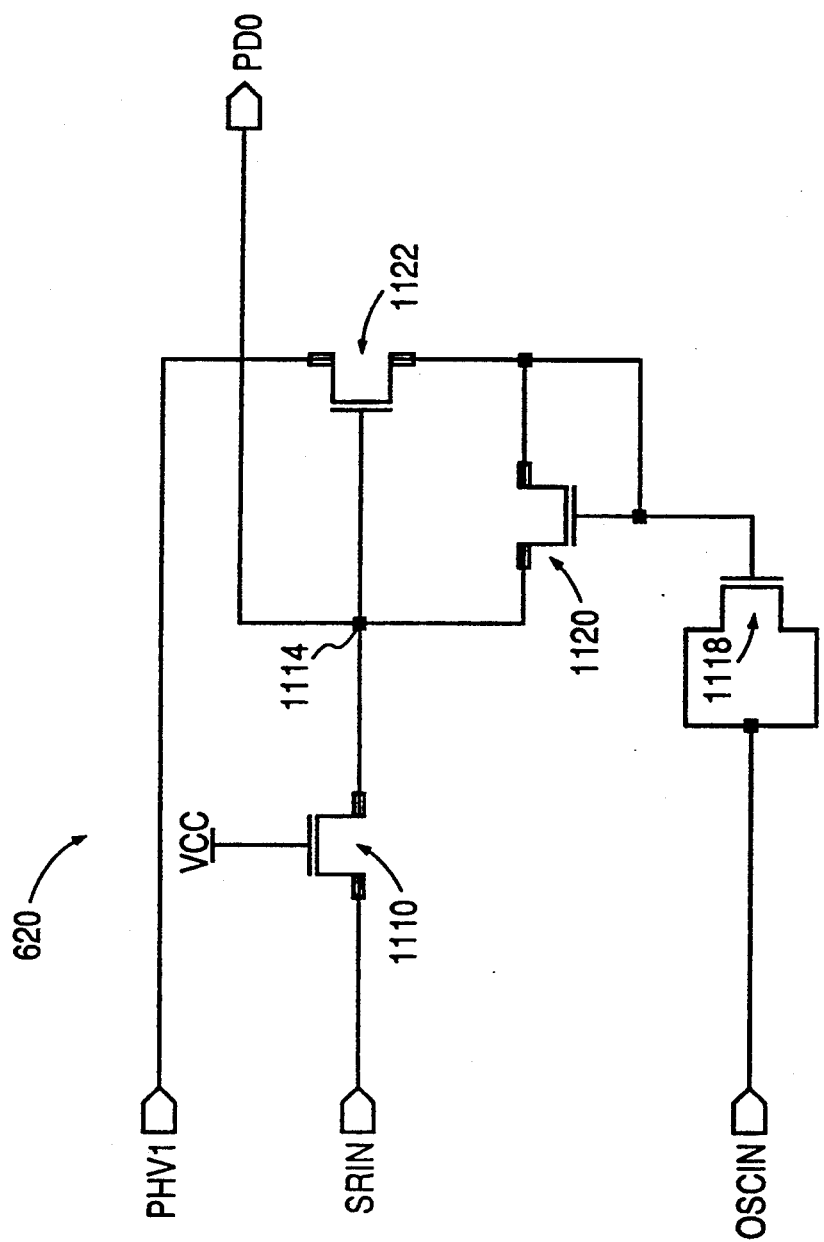

FIG. 11 is a circuit diagram of one embodiment of a programming driver 620. When input SRIN is 0, transistor 1110 pulls node 1114 to ground. Hence output PDO is at ground. When input SRIN is 1, node 1114 charges up. Input signals OSCIN and PHV1 are the same signals as in FIGS. 9 and 10. NMOS transistors 1118, 1120 and 1122 form a charge pump that pumps up the voltage at node 1114 to about 14.5 V. The voltage at node 1114 is provided at output PDO.

While the invention has been described with respect to the embodiments set forth above, other embodiments and variations not described herein are within the scope of the invention. For example, the invention is not limited by the type of the antifuse or by the voltage, current and resistance values. Other embodiments and variations not described herein are to be considered within the scope of the invention, as defined by the following claims.

What is claimed is:

1. An apparatus for programming a programmable circuit, said programmable circuit comprising:
   one or more first channels;
   one or more second channels; and
   one or more antifuses, each antifuse having one electrode connected to one of said first channels and another electrode connected to one of said second channels,
   said apparatus comprising:
   one or more first circuits C1(i), $1 \leq i \leq N1$, N1 being a positive integer, each circuit C1(i) comprising:
      an output 01(i) for being connected to one of said first channels; and
      means DVR1_1(i) for providing a voltage VL1 on said output 01(i) and for providing a voltage VP1 on said output 01(i); and
   one or more second circuits C2(j), $1 \leq j \leq N2$, N2 being a positive integer, each second circuit C2(j) comprising:
      an output 02(j) for being connected to one of said second channels; and
      means DVR2_1(j) for providing a voltage VPP2 greater than VL1 on said output 02(j) when at least one of said first circuits C1 provides said voltage VL1 on its output 01, and for providing a voltage VL2 smaller than VP1 on said output 02(j) when at least one of said first circuits C1 provides said voltage VP1 on its output 01,
   wherein, for each first circuit C1(i), for each second circuit C2(j) and for each said antifuse A,
      said first circuit C1(i) can provide said voltage VL1 and said second circuit C2(j) can provide said voltage VPP2 for a sufficient time and with a sufficient current to program said antifuse A when one electrode E1 of said antifuse A is connected to said output 01(i) and the other electrode E2 of said antifuse A is connected to said output 02(j); and
      said first circuit C1(i) can provide said voltage VP1 and said second circuit C2(j) can provide said voltage VL2 for a sufficient time and with a sufficient current to reduce the resistance of said antifuse A after said antifuse A has been programmed, when said first electrode E1 is connected to said output 01(i) and said second electrode E2 is connected to said output 02(j).

2. The apparatus of claim 1 wherein:
   VL1 and VL2 are 0V;
   VP1 is 9 V; and
   VPP2 is at least 12 V and at most 13 V.

3. The apparatus of claim 1, wherein VL1 is less than VP1 and VL2 is less than VPP2.

4. The apparatus of claim 1 further comprising means for limiting a magnitude of a current on each of said outputs 01 and 02 to a first value.

5. The apparatus of claim 4 wherein said first value is 30 mA.

6. The apparatus of claim 4 wherein said current limiting means limits said current magnitude to said first value when at least one first circuit C1 provides said voltage VL1 and at least one second circuit C2 provides said voltage VPP2; and
   wherein said current limiting means limits said current magnitude to a second value less than said first value when at least one first circuit C1 provides said voltage VP1 and at least one second circuit C2 provides said voltage VL2.

7. The apparatus of claim 4 wherein said first value is 30 mA and said second value is 25 mA.

8. The apparatus of claim 1 further comprising said programmable circuit, wherein:
   output 01 of each first circuit C1 is coupled to one of said first channels; and
   output 02 of each second circuit C2 is coupled to one of said second channels.

9. The apparatus of claim 1 wherein each of said antifuses is an amorphous silicon antifuse.

10. The apparatus of claim 1 wherein the difference VPP2-VL1 is greater than VP1-VL2.

11. The apparatus of claim 1 wherein VP1-VL2 is at most 80% of VPP2-VL1.

12. The apparatus of claim 1 wherein said programmable circuit comprises a channel CH such that one of said first channels and one of said second channels are segments of said channel CH; and
   wherein one of said antifuses is a pass link programmably interconnecting said segments.

13. The apparatus of claim 1 wherein, for all i, said means DVR_1(i) of said circuit C1(i) further comprises:
   means for providing high impedance on output 01(i) when at least one of said circuits C2 provides said voltage VL2 or said voltage VPP2 on its output 02; and
   means for providing a voltage VI1 on output 01(i), said voltage VI1 being such that neither voltage (VI1-VL2) nor voltage (VPP2-VI1) across any one of said antifuses are sufficient to program any one of said antifuses; and
   wherein, for each j, said means DVR2_1(j) of said circuit C2(j) further comprises:
   means for providing high impedance on output 02(j) when at least one of said circuits C1 provides said voltage VL1 or said voltage VP1 on its output 01; and
   means for providing a voltage VI2 on output 02(j), said voltage VI2 being such that neither voltage (VI2-VL1) nor voltage (VP1-VI2) across any one of said antifuses are sufficient to program any one of said antifuses.

14. The apparatus of claim 1 wherein N1>1,
   wherein each first circuit C1(i) comprises means CELL1(i) for storing data and for controlling said means DVR1_1(i) in accordance with said data, said means DVR1_1(i) being for providing, on said output 01(i):
   high impedance when said data have a predetermined value; and
   one of said voltages VL1 and VP1 when said data have another predetermined value;
   wherein each means CELL1(i) has an input IN1(i) for receiving data; and
   wherein each means CELL1(i) such that i<N1 comprises:
   an output OUT1(i) for providing data to the input IN1(i+1) of the means CELL1(i+1), and
   means for transferring data from said input IN1(i) to said output OUT1(i).

15. The apparatus of claim 14 wherein N2>1, and wherein each second circuit C2(j) comprises:
   means CELL2(j) for storing data and for controlling said means DVR2_1(j) in accordance with said data, said means DVR2_1(j) being for providing, on said output 02(j):

high impedance when the data in means CELL2(j) have a predetermined value; and one of said voltages VL2 and VPP2 when the data in means CELL2(j) have another predetermined value;

wherein each means CELL2(j) has an input IN2(j) for receiving data; and wherein each means CELL2(j) such that j<N2 comprises:

an output OUT2(j) for providing data to the input IN2(j+1) of the means CELL2(j+1); and means for transferring data from said input IN2(j) to said output OUT2(j).

16. The apparatus of claim 15 wherein said means CELL1(N1) further comprises:

an output OUT1(N1) for providing data; and means for transferring data from said input IN1(N1) to said output OUT1(N1).

17. The apparatus of claim 16 further comprising means for connecting said output OUT1(N1) to said input IN2(1).

18. The apparatus of claim 15 wherein:

each said means DVR1_1 provides a voltage VI1 when data are being entered into at least one of said means CELL1, said voltage VI1 being such that neither voltage (VI1-VL2) nor voltage (VPP2-VI1) across any one of said antifuses are sufficient to program any one of said antifuses; and each said means DVR2_1 provides a voltage VI2 when data are being entered into at least one of said means CELL2, said voltage VI2 being such that neither voltage (VI2-VL1) nor voltage (VP1-VI2) across any one of said antifuses are sufficient to program any one of said antifuses.

19. The apparatus of claim 1 wherein N1>1, wherein each said antifuse is a cross link positioned at an intersection of one of said first channels with one of said second channels;

wherein each first circuit C1(i) comprises means CELL1(i) for storing data and for controlling said means DVR1_1(i) in accordance with said data, said means DVR1_1(i) being for providing on said output 01(i):

high impedance when said data have a predetermined value; and one of said voltages VL1 and VP1 when said data have another predetermined value;

wherein one or more of said second channels comprise each a plurality of segments, and wherein said apparatus further comprises:

one or more pass links, each pass link programmably interconnecting adjacent segments of one of said second channels;

one or more controllable switches, each controllable switch connected between adjacent segments interconnected by one of said pass links; and one or more means DC_2, each means DC_2 being for storing data and for controlling one or more of said switches in accordance with said data; wherein each means CELL1(i) and each means DC_2 comprises an input IN for receiving data; and wherein each means CELL1(i) and DC132, except one, further comprises:

an output OUT for providing data to the input IN of one of said means CELL1(i) and DC_2; and for its input IN and its output OUT, means for transferring data from said input IN to said output OUT.

20. The apparatus of claim 19 wherein each switch is a transistor.

21. The apparatus of claim 19 wherein each one of said means DC_2 comprises means for opening the respective switches while data are being entered into said one means DC_2.

22. The apparatus of claim 1 wherein N1>1, wherein each first circuit C1(i) comprises means CELL1(i) for storing data and for controlling said means DVR1_1(i) in accordance with said data, said means DVR1_1(i) being for providing on said output 01(i):

high impedance when said data have a predetermined value; and one of said voltages VL1 and VP1 when said data have another predetermined value;

wherein said programmable circuit comprises a plurality of logic cells;

wherein one of said second channels has a first portion connected to a terminal of one of said logic cells and a second portion connected to a terminal of another one of said logic cells;

wherein said programmable circuit comprises a controllable switch interconnecting said terminals of said logic cells;

wherein said apparatus further comprises means DC_2 for storing data nd for controlling said switch in accordance with said data;

wherein each means CELL1(i) and DC_2 comprises an input IN for receiving data; and wherein each means CELL1(i) and DC_2, except one, further comprises:

an output OUT for providing data to the input IN of one of said means CELL1(i) and DC_2; and for its input IN and its output OUT, means for transferring data from said input IN to said output OUT.

23. The apparatus of claim 22 wherein said means DC_2 comprises means for opening said switch while data are being entered into said means DC_2.

24. The apparatus of claim 14 further comprising:

means CDVR1 for providing voltages VL1 and VP1 to all said means DVR1_1; and means CELL1(0) for storing data and for controlling said means CDVR1 in accordance with the data in said means CELL1(0) so that said means CDVR1 provides to all said means DVR1_1:

said voltage VL1 if the data in said means CELL-1(o) has a predetermined value; and said voltage VP1 if the data in said means CELL1(0) has another predetermined value; and wherein said means CELL1(0) comprises:

an input IN1(0) for receiving data; said input IN1(1) of the means CELL1(1); and means for transferring data from said input IN1(0) to said output OUT1(0).

25. The apparatus of claim 1 wherein N1>1 and N2>1, and wherein any number of said circuits C1 can provide either one of said voltages VL1 and VP1 on the respective outputs 01 and any number of said circuits C2 can provide either one of said voltages VL2 and VPP2 on the respective outputs 02 at the same time.

26. A programmable circuit comprising:

a plurality of channels CH1(i), $1 \leq i \leq N1$, N1 being an integer greater than 1, each channel CH1(i) having a first end and a second end;

a plurality of channels CH2(j), $1 \leq j \leq N2$, N2 being an integer greater than 1, each channel CH2(j) intersecting each channel CH1(i);

for each one of a plurality of selected pairs of channels CH1(i), CH2(j), a cross link CL(i,j) having one electrode connected to said channel CH1(i) and another electrode connected to said channel CH2(j);

a driver circuit C1(i) for each channel CH1(i), each driver circuit C1(i) comprising:
   an output PDO connected to the first end of the respective channel CH1(i);
   means M1(i) for storing data;
   an input PHV; and
   an input MODE,
   wherein when a signal on said input MODE has a first value, said driver circuit C1(i) electrically connects its output PDO to its input PHV; and
   wherein when the signal on said input MODE has a second value, said driver circuit C1(i):
      provides on its output PDO high impedance if the data stored in said means M1(i) have a third value; and
      electrically connects its output PDO to its input PHV if the data in said means M1(i) have a fourth value;

wherein said programmable circuit further comprises a control circuit CC1 comprising:
   an output PHV connected to the inputs PHV of all said driver circuits C1(i);
   means M1(0) for storing data;
   input MODE; and
   an input VPP,
   wherein when the signal on said input MODE of said circuit CC1 has a fifth value, said control circuit CC1 provides a voltage VI on its output PHV, and
   wherein when the signal on said input MODE of said circuit CC1 has a sixth value, said control circuit CC1:
      provides on its output PHV a reference voltage VR if the data stored in said means M1(0) have a seventh value; and
      electrically connects its output PHV to its input VPP if the data in said means M1(0) have an eighth value;

wherein said programmable circuit further comprises a driver circuit C2(j) for each channel CH2(j), each driver circuit C2(j) comprising:
   an output PDO connected to the respective channel CH2(j);
   means M2(j) for storing data;
   an input PHV; and
   an input MODE,
   wherein when a signal on said input MODE of said driver circuit C2(j) has a ninth value, said driver circuit C2(j) electrically connects its output PDO to its input PHV; and
   wherein when the signal on said input MODE of said driver circuit C2(j) has a tenth value, said driver circuit C2(j):
      provides on its output PDO high impedance if the data stored in said means M2(j) have an eleventh value; and
      electrically connects its output PDO to its input PHV if the data in said means M2(j) have a twelfth value; and wherein said programmable circuit further comprises a control circuit CC2 comprising:
   an output PHV connected to the inputs PHV of all said driver circuits C2(j);
   means M2(0) for storing data;
   an input MODE; and
   an input VPP,
   wherein when the signal on said input MODE of said circuit CC2 has a thirteenth value, said control circuit CC2 provides said voltage VI on its output PHV, and
   wherein when the signal on said input MODE has a fourteenth value, said control circuit CC2:
      provides on its output PHV said reference voltage VR if the data stored in said means M2(0) have a fifteenth value; and
      electrically connects its output PHV to its input VPP if the data in said means M2(0) have a sixteenth value;

wherein voltage VI-VR across any said cross link CL(i,j) is insufficient to program said cross link CL(i,j).

27. The programmable circuit of claim 26 wherein said input MODE of said control circuit CC1 comprises two input ports MODE1 and MODE2.

28. The programmable circuit of claim 26 further comprising means for providing a programming voltage VPP to said inputs VPP of said control circuits CC1 and CC2, wherein, for each cross link CL(i,j),
   voltage VPP-VI across said cross link CL(i,j) is insufficient to program said cross link CL(i,j), and
   voltage VPP-VR across said cross link CL(i,j) is sufficient to program said cross link CL(i,j).

29. The programmable circuit of claim 26 wherein:
   each means M1(i), $0 \leq i \leq N1$, further comprises an input IN for receiving data and an output OUT for providing data stored in said means M1(i); and
   each one of said outputs OUT of all said means M1(i), $0 \leq i \leq N1$, except one, is connected to one of said inputs IN of said means M1(i), $0 \leq i \leq N1$, so that all said means M1(i), $0 \leq i \leq N1$, form a shift register whereby data can be shifted into all said means M1(i), $0 \leq i \leq N1$, from one of said inputs IN of said means M1(i), $0 \leq i \leq N1$;
   wherein each means M2(j), $0 \leq j \leq N2$, further comprises an input IN for receiving data and an output OUT for providing data stored in said means M2(j); and
   each one of said outputs OUT of said means M2(j), $0 \leq j \leq N2$, except one, is connected to one of said inputs IN of said means M2(j), $0 \leq j \leq N2$, so that all said means M2(j), $0 \leq j \leq N2$, form a shift register whereby data can be shifted into all said means M2(j), $0 \leq j \leq N2$, from one of said inputs IN of said means M2(j), $0 \leq j \leq N2$.

30. The programmable circuit of claim 29 further comprising, for each channel CH1(i), a driver circuit C3(i), each driver circuit C3(i) comprising:
   an output PDO connected to the second end of the respective channel CH1(i);
   means M3(i) for storing data, said means M3(i) comprising an input IN for receiving data and an output OUT for providing data stored in said means M3(i);
   an input PHV; and
   an input MODE, wherein when a signal on said input MODE of said circuit C3(i) has a seventeenth value, said driver circuit C3(i) electrically connects its output PDO to its input PHV; and wherein when the signal on said input MODE of said circuit C3(i) has an eighteenth value, said driver circuit C3(i):
provides on its output PDO high impedance if the data stored in said means M3(i) have a nineteenth value; and
electrically connects its output PDO to its input PHV if the data in said means M3(i) have a twentieth value;

wherein said programmable circuit further comprises a control circuit CC3 comprising:
an output PHV connected to the inputs PHV of all said driver circuits C3(i);
means M3(0) for storing data, said means M3(0) comprising an input IN for receiving data and an output OUT for providing data stored in said means M3(0);
an input MODE; and
an input VPP, wherein when the signal of said input MODE of said circuit CC3 has a twenty-first value, said control circuit CC3 provides said voltage VI on its output PHV, and wherein when the signal on said input MODE of said circuit CC3 has a twenty-second value, said control circuit CC3:
provides on its output PHV said reference voltage VR if the data stored in said means M3(0) have a twenty-third value; and
electrically connects its output PHV to its input VPP if the data in said means M3(0) have a twenty-fourth value;

wherein each one of said outputs OUT of all said means M3(i), $0 \leq i \leq N1$, except one, is connected to one of said inputs IN of said means M3(i), $0 \leq i \leq N1$, so that all said means M3(i), $0 \leq i \leq N1$, form a shift register whereby data can be shifted into all said means M3(i), $0 \leq i \leq N1$, from one of said inputs IN of said means M3(i), $0 \leq i \leq N1$.

31. The programmable circuit of claim 30 further comprising:
one or more pass links, each pass link segmenting one of said channels CH1(i);
one or more pass transistors, each pass transistor being connected in parallel with one of said pass links, each pass transistor having a control terminal;
one or more circuits DC_2 for controlling said pass transistors, each circuit DC_2 comprising:
an output PDO connected to one or more of said control terminals;
means M_2 for storing data, said means M_2 comprising an input IN for receiving data and an output OUT for providing data stored in said means M_2; and
an input MODE, wherein when a signal on said input MODE of said circuit DC_2 has a twenty-fifth value, said circuit DC_2 provides a voltage VH on its output PDO; and wherein when a signal on said input MODE of said circuit DC_2 has a twenty-sixth value, said circuit DC_2:
provides on its output PDO said reference voltage VR if the data stored in said means M_2 have a twenty-seventh value; and
provides on its output PDO said voltage VH if the data in said means M_2 have a twenty-eighth value;

wherein each one of said outputs OUT of all said means M_2 and M2(j), $0 \leq j \leq N2$, except one, is connected to one of said inputs IN of said means M_2 and M2(j), $0 \leq j \leq N2$, so that all said means M_2 and M2(j), $0 \leq j \leq N2$, form a shift register whereby data can be shifted into all said means M_2 and M2(j), $0 \leq j \leq N2$, from one of said inputs IN of said means M_2 and M2(j), $0 \leq j \leq N2$.

32. The programmable circuit of claim 30 further comprising:
a first logic cell having a first terminal; and
a second logic cell having a second terminal;
wherein one of said channels CH1(i) comprises a first segment connected to said first terminal and a second segment connected to said second terminal;
wherein said programmable circuit further comprises:
a pass transistor interconnecting said first and second segments, said pass transistor having a control terminal;
a circuit DC_2 for controlling said pass transistor, said circuit DC_2 comprising:
an output PDO connected to said control terminal;
means M_2 for storing data, said means M_2 comprising an input IN for receiving data and an output OUT for providing data stored in said circuits DC_2; and
an input MODE;

wherein when a signal on said input MODE of said circuit DC_2 has a twenty-fifth value, said circuit DC_2 provides a voltage VH on its output PDO; and wherein when a signal on said input MODE of said circuit DC_2 has a twenty-sixth value, said circuit DC_2:
provides on its output PDO said reference voltage VR if the data stored in said means M_2 have a twenty-seventh value; and
provides on its output PDO said voltage VH if the data in said means M_2 have a twenty-eighth value;

wherein each of said outputs OUT of all said means M_2 and M2(j), $0 \leq j \leq N2$, except one, is connected to one of said inputs IN of said means M_2 and M2(j), $0 \leq j \leq N2$, so that all said means M_2 and M2(j), $0 \leq j \leq N2$, form a shift register whereby data can be shifted into all said means M_2 and M2(j), $0 \leq j \leq N2$, from one of said inputs IN of said means M_2 and M2(j), $0 \leq j \leq N2$.

* * * * *